(12) United States Patent
Moriyama et al.

(10) Patent No.: US 7,130,224 B2
(45) Date of Patent: Oct. 31, 2006

(54) COMPOSITE STORAGE CIRCUIT AND SEMICONDUCTOR DEVICE HAVING THE SAME COMPOSITE STORAGE CIRCUIT

(75) Inventors: Katsutoshi Moriyama, Saga (JP); Hironobu Mori, Nagasaki (JP); Nobumichi Okazaki, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 10/522,316

(22) PCT Filed: Jul. 22, 2003

(86) PCT No.: PCT/JP03/09295

§ 371 (c)(1), (2), (4) Date: Jan. 25, 2005

(87) PCT Pub. No.: WO2004/012198

PCT Pub. Date: Feb. 5, 2004

(65) Prior Publication Data

US 2005/0226033 A1    Oct. 13, 2005

(30) Foreign Application Priority Data

Jul. 29, 2002  (JP) ............................. 2002-220423

(51) Int. Cl.
G11C 7/06    (2006.01)

(52) U.S. Cl. ............. 365/189.07; 365/149; 365/185.08

(58) Field of Classification Search ............ 365/185.08, 365/149, 189.07
See application file for complete search history.

(56) References Cited

U.S. PATENT DOCUMENTS 5,193,176 A * 3/1993 Brandin ........................ 714/14
6,958,937 B1 * 10/2005 Forbes .................. 365/189.07

FOREIGN PATENT DOCUMENTS

| JP | 04-042496 | 2/1992 |
|---|---|---|
| JP | 05-289949 | 11/1993 |
| JP | 09-161489 | 6/1997 |
| JP | 2000-040037 | 2/2000 |
| JP | 2001-352475 | 12/2001 |

OTHER PUBLICATIONS

International Search Report Nov. 4, 2003.

* cited by examiner

*Primary Examiner*—Huan Hoang
(74) *Attorney, Agent, or Firm*—Rader, Fishman & Grauer; Ronald P. Kananen

(57) ABSTRACT

An object of the present invention is to provide a compound storage circuit that includes a storage circuit including a volatile storage circuit and a nonvolatile storage circuit connected in parallel to each other and that is arranged to be capable of an instant-on function by storing information equal to storage information stored in the volatile storage circuit into the nonvolatile storage circuit, the compound storage circuit being capable of reducing power consumption, and a semiconductor device including the compound storage circuit.

According to the present invention, in a compound storage circuit including a volatile storage circuit and a nonvolatile storage circuit connected in parallel to each other and a semiconductor device including the compound storage circuit, a determination circuit for comparing first storage information stored in the volatile storage circuit with second storage information that has already been stored in the nonvolatile storage circuit when storage information stored in the volatile storage circuit is written into the nonvolatile storage circuit is provided, and the first storage information is written into the nonvolatile storage circuit only when the first storage information is not equal to the second storage information.

19 Claims, 3 Drawing Sheets

US 7,130,224 B2

COMPOSITE STORAGE CIRCUIT AND SEMICONDUCTOR DEVICE HAVING THE SAME COMPOSITE STORAGE CIRCUIT

TECHNICAL FIELD

The present invention relates to a compound storage circuit including a volatile storage circuit and a nonvolatile storage circuit that are connected in parallel to each other and a semiconductor device including the compound storage circuit.

BACKGROUND ART

In a semiconductor device that is incorporated in an electronic computer or the like, such as a personal computer, and that performs predetermined processing, a volatile storage circuit has been provided according to need, so that the processing is performed while information necessary for the processing is sequentially stored into the volatile storage circuit.

Such a volatile storage circuit stores information by supplying electric power and has a characteristic of high writing and reading speed. In contrast, the volatile storage circuit has a characteristic of losing stored information when a power supply is interrupted due to a power-off operation, a sudden power failure, or the like. Thus, when a power source is turned on again after the interruption of the power supply, information stored before the interruption of the power supply does not exist in the volatile storage circuit. Therefore, information stored before the interruption of the power supply cannot be recovered.

Recently, an instant-on technology has been suggested. In the instant-on technology, a storage circuit includes a volatile storage circuit and a nonvolatile storage circuit that are connected in parallel to each other, and information equal to that stored in the volatile storage circuit is stored into the nonvolatile storage circuit. Thus, when a power supply is interrupted due to a power-off operation, a sudden power failure, or the like, necessary information is stored into the nonvolatile storage circuit. Then, when the power supply resumes, the state before the interruption of the power supply can be immediately recovered by using the information stored in the nonvolatile storage device.

However, in the above-mentioned storage circuit, even if information that has already been stored in the nonvolatile storage circuit is equal to information stored in the volatile storage circuit, writing processing of writing the information into the nonvolatile storage circuit must be performed. Thus, unnecessary power is consumed.

In particular, due to the nonvolatility, nonvolatile storage circuits require a lot of electric energy to write storage information. This is a factor preventing a reduction in power consumption.

DISCLOSURE OF INVENTION

In order to solve the above-mentioned problems, according to an aspect of the present invention, a compound storage circuit that includes a volatile storage circuit and a nonvolatile storage circuit connected in parallel to each other and that is arranged such that information equal to storage information stored in the volatile storage circuit is stored into the nonvolatile storage circuit includes a determination circuit for comparing first storage information stored in the volatile storage circuit with second storage information that has already been stored in the nonvolatile storage circuit when the storage information stored in the volatile storage circuit is written into the nonvolatile storage circuit. The first storage information is written into the nonvolatile storage circuit only when the first storage information is not equal to the second storage information.

In the compound storage circuit, the determination circuit includes comparison determination means for comparing the first storage information with the second storage information; and writing means for writing the first storage information into the nonvolatile storage circuit only when the first storage information is not equal to the second storage information.

In the compound storage circuit, the nonvolatile storage circuit includes a magnetic tunnel junction element as storage means.

In the compound storage circuit, when electric power supplied to the volatile storage circuit is reduced, the storage information stored in the volatile storage circuit is written into the nonvolatile storage circuit. When the power supply resumes after the electric power supplied is reduced, the storage information stored in the nonvolatile storage circuit is returned into the volatile storage circuit.

In the compound storage circuit, each of the volatile storage circuit and the nonvolatile storage circuit includes a power source supply means that operates when the electric power supplied is reduced.

In the compound storage circuit, the nonvolatile storage circuit includes a magnetic tunnel junction element as storage means.

In the compound storage circuit, the determination circuit includes comparison determination means for comparing the first storage information with the second storage information; and writing means for writing the first storage information into the nonvolatile storage circuit only when the first storage information is not equal to the second storage information.

In the compound storage circuit, the nonvolatile storage circuit includes a magnetic tunnel junction element as storage means.

According to another aspect of the present invention, a semiconductor device including a compound storage circuit that includes a volatile storage circuit and a nonvolatile storage circuit connected in parallel to each other and that is arranged such that information equal to storage information stored in the volatile storage circuit is stored into the nonvolatile storage circuit includes a determination circuit for comparing first storage information stored in the volatile storage circuit with second storage information that has already been stored in the nonvolatile storage circuit when the storage information stored in the volatile storage circuit is written into the nonvolatile storage circuit. The first storage information is written into the nonvolatile storage circuit only when the first storage information is not equal to the second storage information.

In the semiconductor device, the determination circuit includes comparison determination means for comparing the first storage information with the second storage information; and writing means for writing the first storage information into the nonvolatile storage circuit only when the first storage information is not equal to the second storage information.

In the semiconductor device, the nonvolatile storage circuit includes a magnetic tunnel junction element as storage means.

In the semiconductor device, when electric power supplied to the volatile storage circuit is reduced, the storage information stored in the volatile storage circuit is written into the nonvolatile storage circuit. When the power supply resumes after the electric power supplied is reduced, the storage information stored in the nonvolatile storage circuit is returned into the volatile storage circuit.

In the semiconductor device, each of the volatile storage circuit and the nonvolatile storage circuit includes a power source supply means that operates when the electric power supplied is reduced.

In the semiconductor device, the nonvolatile storage circuit includes a magnetic tunnel junction element as storage means.

In the semiconductor device, the determination circuit includes comparison determination means for comparing the first storage information with the second storage information; and writing means for writing the first storage information into the nonvolatile storage circuit only when the first storage information is not equal to the second storage information.

In the semiconductor device, a magnetic tunnel junction element is used as storage means.

BEST MODE FOR CARRYING OUT THE INVENTION

Figure 1:
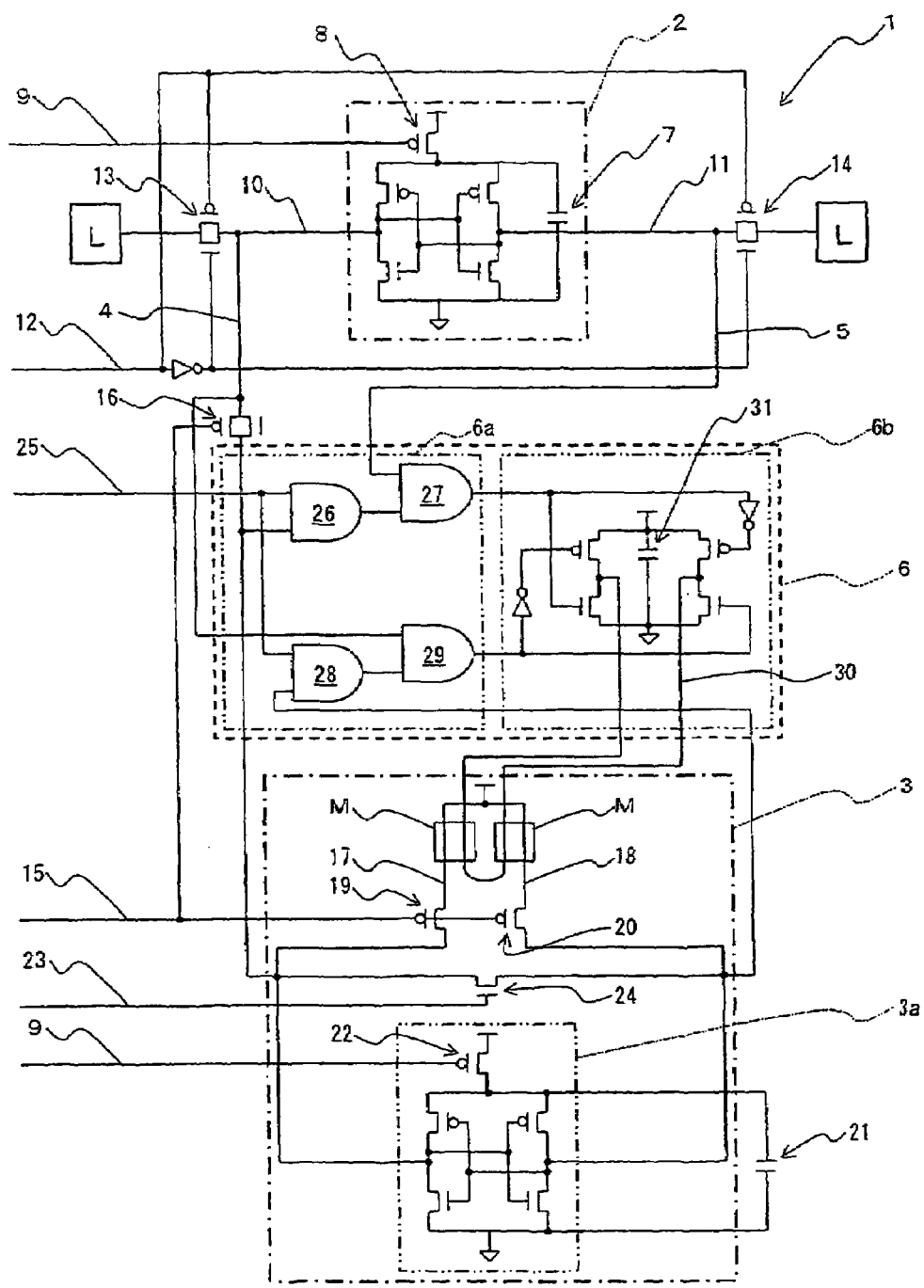
FIG. 1 is a circuit diagram showing a compound storage circuit according to the present invention.

According to a compound storage circuit and a semiconductor device including the compound storage circuit of the present invention, the compound storage circuit includes a volatile storage circuit and a nonvolatile storage circuit that are connected in parallel to each other, and information equal to that stored in the volatile storage circuit is stored into the nonvolatile storage circuit.

The compound storage circuit also includes a determination circuit for comparing first storage information stored in the volatile storage circuit with second storage information that has already been stored in the nonvolatile storage circuit and for determining whether or not the first storage information is equal to the second storage information when the information stored in the volatile storage circuit is written into the nonvolatile storage circuit.

When the determination circuit determines that the first storage information is not equal to the second storage information, the first storage information is written into the nonvolatile storage circuit. When the determination circuit determines that the first storage information is equal to the second storage information, the first storage information is not written into the nonvolatile storage circuit.

Thus, since writing into the nonvolatile storage circuit is not performed when the first storage information is equal to the second storage information, the number of writing times into the nonvolatile storage circuit can be reduced. Therefore, power consumption can be reduced.

In particular, in a case where storage information stored in the volatile storage circuit is written into the nonvolatile storage circuit when electric power supplied to the volatile storage circuit is reduced, the storage information stored in the volatile storage circuit can be written into the nonvolatile storage circuit only when the storage information stored in the volatile storage circuit is likely to be lost due to the reduction in the electric power supplied.

Accordingly, in the compound storage circuit, an occurrence of writing processing of writing information to be overwritten by the subsequent writing processing without being read from the nonvolatile storage circuit is prevented. Thus, the power consumption can be reduced.

Information to be written into the nonvolatile storage circuit is information used when the power supply resumes after the power supply is reduced. The information written into the nonvolatile storage circuit is written into the volatile storage circuit when the power supply resumes. Thus, necessary information can be used from the volatile storage circuit, which has a high reading speed, and a quick instant-on function can be realized.

A semiconductor device including the above-described compound storage circuit formed on a semiconductor substrate is capable of storing an operation state when the power supply is interrupted by using the compound storage circuit. In addition, when the power supply resumes, the state immediately before the interruption of the power supply can be quickly recovered by using information stored in the compound storage circuit.

Thus, if the semiconductor device constitutes an electronic apparatus or an electric apparatus, the instant-on function can be realized readily.

In this case, the volatile storage circuit and the nonvolatile storage circuit are not necessarily formed on the same semiconductor substrate. The volatile storage circuit and the nonvolatile storage circuit may be formed on respective semiconductor substrates, so that the volatile storage circuit and the nonvolatile storage circuit can be connected in parallel to each other using desired wiring.

Embodiments of the present invention will be described with reference to the drawings. In particular, explanations will be given in accordance with the following order:

1) Explanation for Compound Storage Circuit
2) Explanation for Process Performed by Compound Storage Circuit When Power Supply Is Interrupted
3) Explanation for Process Performed by Compound Storage Circuit When Power Supply Resumes In the following description, a magnetic storage circuit including a magnetic memory is used in a nonvolatile storage circuit. However, a magnetic storage circuit does not necessarily have to be used. The nonvolatile storage circuit may include an EEPROM, a flash memory, or a ferroelectric memory.

1) Explanation for Structure of Compound Storage Circuit

FIG. 1 is a circuit diagram showing a compound storage circuit 1 according to an embodiment of the present invention. The compound storage circuit 1 includes a volatile storage circuit 2 and a nonvolatile storage circuit 3 that are connected in parallel to each other using a first connection line 4 and a second connection line 5.

In particular, the nonvolatile storage circuit 3 is connected to the volatile storage circuit 2 via a determination circuit 6. As described below, when first storage information stored in the volatile storage circuit 2 is written into the nonvolatile storage circuit 3, the determination circuit 6 compares the first storage information with second storage information that has already been stored in the nonvolatile storage circuit 3, and the first storage information is written into the nonvolatile storage circuit 3 only when the first storage information is not equal to the second storage information.

In this embodiment, the volatile storage circuit 2, the nonvolatile storage circuit 3, and the determination circuit 6 are provided on a semiconductor substrate, and the volatile storage circuit 2 is a latch-type storage circuit arranged in a system LSI chip.

The volatile storage circuit 2 includes a power source 7 for information holding constituted by a capacitor and a first switching transistor 8 for controlling the operation of the power source 7 for information holding. A power switch signal input line 9 is connected to the gate of the first switching transistor 8. The first switching transistor 8 is controlled in accordance with a power switch signal input from the power switch signal input line 9, so that the operation of the power source 7 for information holding is controlled.

A first conducting wire 10 and a second conducting wire 11 connected to other storage circuits and elements are connected to the volatile storage circuit 2. A first circuit selection switch 13 and a second circuit selection switch 14 each connected to a power source separation signal input line 12 are disposed in the first connecting wire 10 and the second conducting wire 11, respectively. In accordance with an input of a power source separation signal from the power source separation signal input line 12, the first circuit selection switch 13 and the second circuit selection switch 14 are turned on and off.

The first connection line 4 whose one end is connected to the first conducting wire 10 is connected to the first conducting wire 10 between the volatile storage circuit 2 and the first circuit selection switch 13. Also, the second connection line 5 whose one end is connected to the second conducting wire 11 is connected to the second conducting wire 11 between the volatile storage circuit 2 and the second circuit selection switch 14.

Also, a third circuit selection switch 16 connected to a read signal input line 15 is disposed in the first connection line 4. In accordance with an input of a read signal from the read signal input line 15, the third circuit selection switch 16 is turned on and off.

A magnetic storage circuit is used in the nonvolatile storage circuit 3, as described above. Information of "0" or "1" is stored using magnetic tunnel junction elements M. Since the latch-type storage circuit as the volatile storage circuit 2 stores 2-bit information, two magnetic tunnel junction elements M are provided so that the nonvolatile storage circuit 3 can store 2-bit information.

The magnetic tunnel junction elements M are connected to a first read line 17 and a second read line 18. The magnetic tunnel junction elements M are connected to an information reading circuit 3a via the first read line 17 and the second read line 18. Accordingly, information from the magnetic tunnel junction elements M can be read.

A first read control switching transistor 19 connected to the read signal input line 15 is disposed in the first read line 17, and a second read control switching transistor 20 connected to the read signal input line 15 is disposed in the second read line 18. Information can be read from the magnetic tunnel junction elements M using the information reading circuit 3a, as described below, by inputting a read signal to the read signal input line 15.

The information reading circuit 3a includes a power source 21 for reading constituted by a capacitor. The information reading circuit 3a also includes a second switching transistor 22 for controlling the operation of the power source 21 for reading. The gate of the second switching transistor 22 is connected to the power switch signal input line 9. The second switching transistor 22 is controlled in accordance with a power switch signal input from the power switch signal input line 9, so that the operation of the power source 21 for reading is controlled.

In this embodiment, the nonvolatile storage circuit 3 also includes an equalizing switching transistor 24 whose base is connected to an equalizing signal input line 23. One end of the equalizing switching transistor 24 is connected to the first read line 17, and the other end of the equalizing switching transistor 24 is connected to the second read line 18.

The determination circuit 6 includes a comparison determination section 6a and a writing driver circuit 6b. The comparison determination section 6a includes a plurality of AND gate circuits. The writing driver circuit 6b performs writing into the nonvolatile storage circuit 3 in accordance with a result determined by the comparison determination section 6a.

The comparison determination section 6a includes a first AND gate circuit 26 and a second AND gate circuit 27. The first AND gate circuit 26 is connected to a write signal input line 25 to receive a write signal and receives a signal of second storage information stored in the volatile storage circuit 3. The second AND gate circuit 27 receives an output signal output from the first AND gate circuit 26 and receives a signal of first storage information stored in the volatile storage circuit 2 via the second connection line 5. The comparison determination section 6a also includes a third AND gate circuit 28 and a fourth AND gate circuit 29. The third AND gate circuit 28 is connected to the write signal input line 25 to receive a write signal and receives a signal of second storage information stored in the volatile storage circuit 3. The fourth AND gate circuit 29 receives an output signal output from the third AND gate circuit 28 and receives a signal of first storage information stored in the volatile storage circuit 2 via the first connection line 4.

Thus, when the comparison determination section 6a determines that first storage information stored in the volatile storage circuit 2 is equal to second storage information stored in the nonvolatile storage circuit 3, the writing driver circuit 6b does not operate. When first storage information stored in the volatile storage circuit 2 is not equal to second storage information stored in the nonvolatile storage circuit 3, the writing driver circuit 6b operates, and a predetermined current for writing is caused to flow in a write line 30 that is connected to the magnetic tunnel junction elements M, so that the first storage information is written into the magnetic tunnel junction elements M.

The writing driver circuit 6b includes a power source 31 for writing constituted by a capacitor. When power supply is interrupted, a predetermined current for writing is caused to flow in the write line 30, which is connected to the magnetic tunnel junction elements M, for a predetermined period, so that writing the first storage information into the magnetic tunnel junction elements M can be ensured.

Normally, a system LSI chip includes many storage circuits 1, and first storage information stored in the volatile storage circuit 2 is equal to second storage information stored in the nonvolatile storage circuit 3 with 50% probability, in terms of the whole system LSI chip. Thus, since providing the determination circuit 6 reduces the number of writing times into the nonvolatile storage circuit 3 by approximately half in terms of the whole system LSI chip, power consumption can be reduced.

Figure 2:
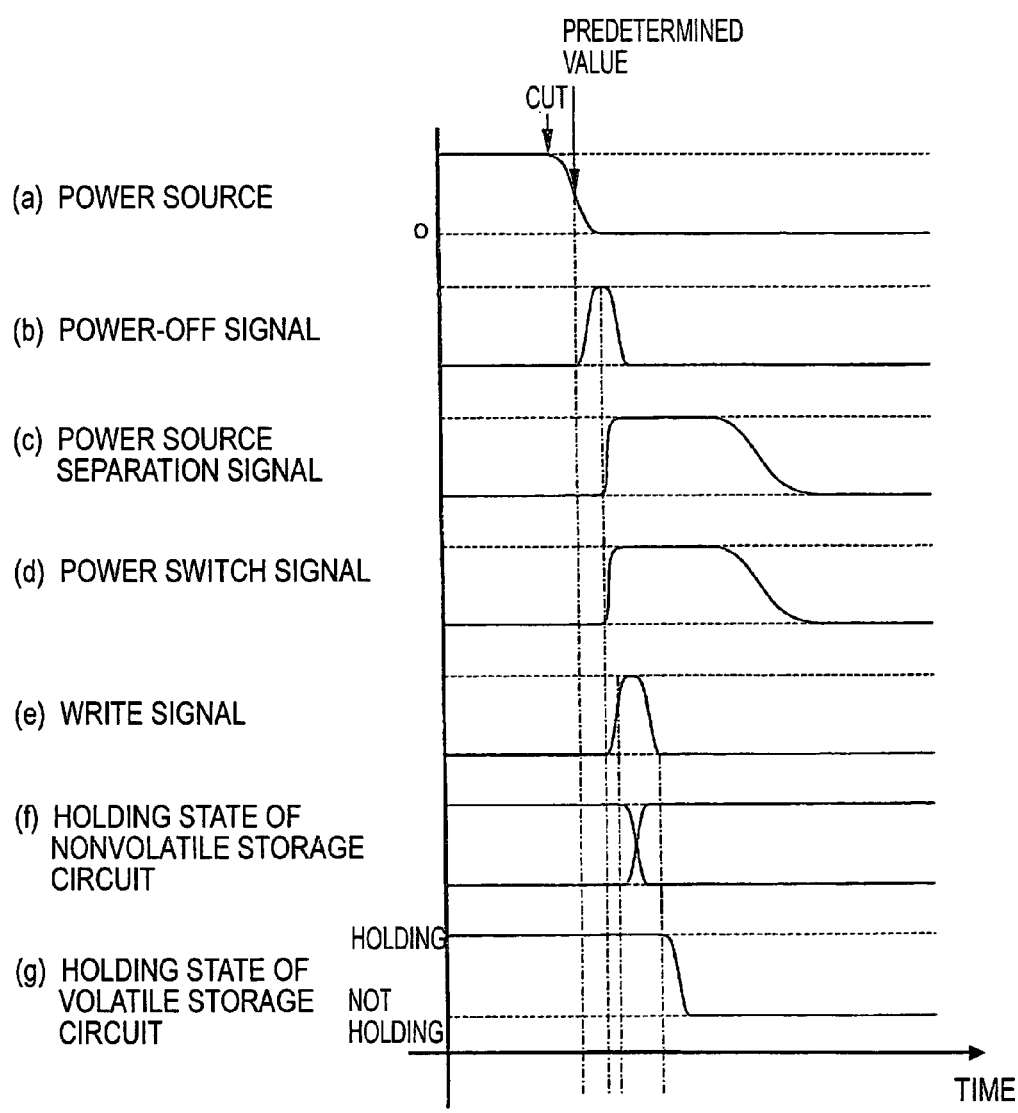
FIG. 2 is a timing chart for explaining a process performed by the compound storage circuit shown by the circuit diagram in FIG. 1.

2) Explanation for Process Performed by Compound Storage Circuit When Power Supply Is Interrupted A process performed by the compound storage circuit 1 when the power supply is interrupted will be described with reference to a timing chart shown in FIG. 2. Not only turning off of a main power source due to a shutdown operation but also a power failure or unexpected trouble cause the interruption of the power supply. In the following explanations, a case where a main power source is turned off due to a shutdown operation, which is a general power supply interruption state, will be described. The same process is performed when the power supply is interrupted, irrespective of the reason of the interruption of the power supply.

FIG. 2(a) is a timing chart of electric power in accordance with turning off a main power source of a system LSI chip including the compound storage circuit 1. When the amount of electric power supplied to the system LSI chip is less than or equal to a predetermined value due to the turning off the main power source, a power-off signal generation circuit (not shown) of the system LSI chip operates. The power-off signal generation circuit generates a power-off signal, as shown in FIG. 2(b).

A power source separation signal generation circuit (not shown) operates in accordance with the power-off signal. The power source separation signal generation circuit generates a power source separation signal, as shown in FIG. 2(c).

The power source separation signal is input to the first circuit selection switch 13 and the second circuit selection switch 14 via the power source separation signal input line 12. The first circuit selection switch 13 and the second circuit selection switch 14 cut off the first conducting wire 10 and the second conducting wire 11, respectively.

Cutting off the first conducting wire 10 and the second conducting wire 11 causes the volatile storage circuit 2 to be independent from other storage circuits and elements connected via the first conducting wire 10 and the second conducting wire 11. Thus, information is prevented from being input to the volatile storage circuit 2, and storage information stored in the volatile storage circuit 2 is inhibited from being changed after the power supply is turned off.

In other words, if the first conducting wire 10 and the second conducting wire 11 are connected to the other storage circuits and elements, an electric charge is dissipated from a drain side of a transistor constituting the volatile storage circuit 2 due to a reduction in the electric power supplied to the volatile storage circuit 2. Thus, storage information may be autonomously changed.

Although a transfer gate is used for the first circuit selection switch 13 and the second circuit selection switch 14, any arrangement similar to a transfer gate capable of preventing electric charge dissipation of a transistor constituting the volatile storage circuit 2 is possible.

A power switch signal generation circuit (not shown) operates in accordance with the power-off signal. The power switch signal generation circuit generates a power switch signal, as shown in FIG. 2(d).

The power switch signal is input to the first switching transistor 8 via the power switch signal input line 9 to switch a power source for the volatile storage circuit 2 to the power source 7 for information holding. Also, the power switch signal is input to the second switching transistor 22 via the power switch signal input line 9 to switch a power source for the information reading circuit 3a to the power source 21 for reading.

By operating the power source 7 for information holding and the power source 21 for reading, the volatile storage circuit 2 is capable of storing first storage information for a predetermined period and the nonvolatile storage circuit 3 is capable of reading second information into the comparison determination section 6a of the determination circuit 6, even if the power supply is interrupted due to turning off the main power source.

At the same time as generation of the power source separation signal and the power switch signal in accordance with the power-off signal, a write signal generation circuit (not shown) operates in accordance with the power-off signal. The write signal generation circuit generates a write signal, as shown in FIG. 2(e).

The write signal is input to the first AND gate circuit 26 and the third AND gate circuit 28 of the comparison determination section 6a via the write signal input line 25. The comparison determination section 6a compares first storage information read from the volatile storage circuit 2 with second storage information read from the nonvolatile storage circuit 3.

When the first storage information is equal to the second storage information, there is no need to write the first storage information into the nonvolatile storage circuit 3. Thus, the process terminates without operating the writing driver circuit 6b.

When the first storage information is not equal to the second storage information, the writing driver circuit 6b operates to write the first storage information into the nonvolatile storage circuit 3. A predetermined current for writing is caused to flow in the write line 30, and the first storage information stored in the volatile storage circuit 2 is written into the nonvolatile storage circuit 3, as shown in FIG. 2(f).

By providing the power source 31 for writing in the writing driver circuit 6b, the writing driver circuit 6b can be operated for a predetermined period and the first storage information can be written into the nonvolatile storage circuit 3, even if the power supply is interrupted due to turning off the main power source.

If magnetic tunnel junction elements M are used for a magnetic storage circuit in the nonvolatile storage circuit 3, only a short period, such as about dozens of nanoseconds, is required for writing. Thus, the capacity of the power source 7 for information holding, the power source 21 for reading, and the power source 31 for writing, functioning as electric power storing means, can be reduced.

The power source 7 for information holding, the power source 21 for reading, and the power source 31 for writing need the capacity for performing writing processing into the nonvolatile storage circuit 3. As shown in FIGS. 2(f) and 2(g), until writing of first storage information into the nonvolatile storage circuit 3 is completed, the volatile storage circuit 2 stores the first storage information.

The above-described process is performed by the compound storage circuit 1 when the main power source is turned off. Accordingly, by writing first storage information stored in the volatile storage circuit 2 into the nonvolatile storage circuit 3 using a power-off signal as a trigger, generated due to a reduction in the power supply, only information necessary when the power supply resumes after the interruption of the power supply can be stored into the nonvolatile storage circuit 3. Thus, the number of writing times into the nonvolatile storage circuit 3 can be reduced. Therefore, power consumption can be reduced.

Figure 3:
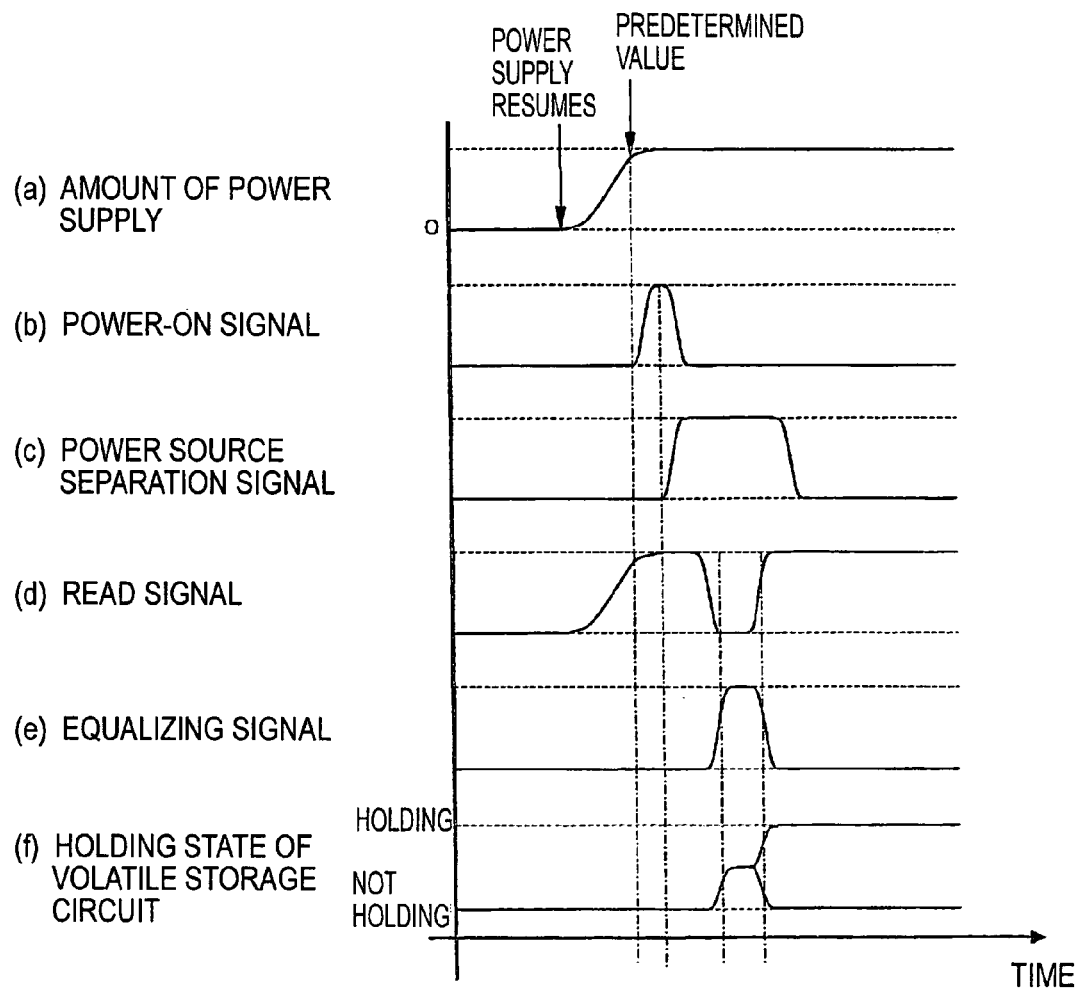
FIG. 3 is a timing chart for explaining a process performed by the compound storage circuit shown by the circuit diagram in FIG. 1.

3) Explanation for Process Performed by Compound Storage Circuit When Power Supply Resumes A process performed by the compound storage circuit 1 when power supply resumes after the power supply is interrupted due to turning off the main power source will be described with reference to a timing chart shown in FIG. 3.

FIG. 3(a) is a timing chart of electric power supplied from the power source to the system LSI chip including the compound storage circuit 1 in accordance with a resumption of the power supply. When the amount of electric power supplied to the system LSI chip reaches a predetermined value, a power-on signal generation circuit (not shown) of the system LSI chip operates. The power-on signal generation circuit generates a power-on signal, as shown in FIG. 3(b).

The power source separation signal generation circuit (not shown) operates in accordance with the power-on signal. The power source separation signal generation circuit generates a power source separation signal, as shown in FIG. 3(c).

The power source separation signal is input to the first circuit selection switch 13 and the second circuit selection switch 14 via the power source separation signal input line 12. The first circuit selection switch 13 and the second circuit selection switch 14 cut off the first conducting wire 10 and the second conducting wire 11, respectively.

Cutting off the first conducting wire 10 and the second conducting wire 11 causes the volatile storage circuit 2 to be independent from other storage circuits and elements connected via the first conducting wire 10 and the second conducting wire 11. Thus, second storage information stored in the nonvolatile storage circuit 3 can be written into the volatile storage circuit 2 without being affected by the other storage circuits and elements.

As shown in FIG. 3(d), a read signal generation circuit (not shown) generates a read signal in synchronization with the start of power supply to the system LSI chip. The read signal is input to the first read control switching transistor 19 and the second read control switching transistor 20, as well as the third circuit selection switch 16, via the read signal input line 15.

Then, in accordance with the power-on signal, an equalizing signal generation circuit (not shown) generates an equalizing signal, as shown in FIG. 3(e), and inputs the equalizing signal to the equalizing signal input line 23.

In accordance with an input of the equalizing signal to the equalizing signal input line 23, equalization is performed for the volatile storage circuit 2, as shown in FIG. 3(f). Here, in the nonvolatile storage circuit 3, second storage information is read from the magnetic tunnel junction elements M into the information reading circuit 3a in accordance with the read signal.

By disabling the equalizing signal and inputting the read signal, the second storage information stored in the nonvolatile storage circuit 3 is read into the volatile storage circuit 2, as shown in FIG. 3(f).

By disabling the power source separation signal after the second storage information is read into the volatile storage circuit 2, the first conducting wire 10 and the second conducting wire 11 that are cut off by the first circuit selection switch 13 and the second circuit selection switch 14, respectively, are connected. Thus, the second storage information read into the volatile storage circuit 2 and the volatile storage circuit 2 itself becomes usable.

The above-described process is performed by the compound storage circuit 1 when the power supply resumes. Accordingly, by returning storage information stored in the nonvolatile storage circuit into the volatile storage circuit when the power supply resumes, necessary information can be used from the volatile storage circuit, which has a high reading speed. Thus, a quick instant-on function can be realized.

INDUSTRIAL APPLICABILITY (1) According to an aspect of the present invention, a compound storage circuit that includes a volatile storage circuit and a nonvolatile storage circuit connected in parallel to each other and that is arranged such that information equal to storage information stored in the volatile storage circuit is stored into the nonvolatile storage circuit includes a determination circuit for comparing first storage information stored in the volatile storage circuit with second storage information that has already been stored in the nonvolatile storage circuit when the storage information stored in the volatile storage circuit is written into the nonvolatile storage circuit. The first storage information is written into the nonvolatile storage circuit only when the first storage information is not equal to the second storage information.

Thus, since the number of writing times into the nonvolatile storage circuit can be reduced, power consumption can be reduced.

(2) In the compound storage circuit, the determination circuit includes comparison determination means for comparing the first storage information with the second storage information; and writing means for writing the first storage information into the nonvolatile storage circuit only when the first storage information is not equal to the second storage information.

Thus, the determination circuit can perform determination processing quickly.

When the first storage information is not equal to the second storage information, writing the first storage information into the nonvolatile storage circuit can be ensured.

(3) In the compound storage circuit, the nonvolatile storage circuit includes a magnetic tunnel junction element as storage means.

Thus, when the first storage information is written into the nonvolatile storage circuit, writing can be performed in a relatively short time.

(4) In the compound storage circuit, when the electric power supplied to the volatile storage circuit is reduced, the storage information stored in the volatile storage circuit is written into the nonvolatile storage circuit. When the power supply resumes after the electric power supplied is reduced, the storage information stored in the nonvolatile storage circuit is returned into the volatile storage circuit.

Thus, only when storage information stored in the volatile storage circuit is likely to be lost due to a reduction in power supply, writing the storage information stored in the volatile storage circuit into the nonvolatile storage circuit can be ensured. This reduces the number of writing times into the nonvolatile storage circuit, thus reducing power consumption. In addition, information to be written into the nonvolatile storage circuit is information necessary when the power supply resumes after the reduction in the power supply. In addition, by returning the storage information stored in the nonvolatile storage circuit into the volatile storage circuit when the power supply resumes, necessary information can be used from the volatile storage circuit, which has a high reading speed. Thus, a quick instant-on function can be realized.

(5) In the compound storage circuit, each of the volatile storage circuit and the nonvolatile storage circuit includes power source supply means that operates when the electric power supplied is reduced.

Thus, even if the power supply is reduced, the power source supply means can operate the volatile storage circuit and the nonvolatile storage circuit for a predetermined period. Accordingly, storing necessary information into the nonvolatile storage circuit can be ensured.

(6) In the compound storage circuit, the nonvolatile storage circuit includes a magnetic tunnel junction element as storage means.

Thus, when the first storage information is written into the nonvolatile storage circuit, writing can be performed in a relatively short time.

(7) In the compound storage circuit, the determination circuit includes comparison determination means for comparing the first storage information with the second storage information; and writing means for writing the first storage information into the nonvolatile storage circuit only when the first storage information is not equal to the second storage information.

Thus, the determination circuit can perform determination processing quickly.

When the first storage information is not equal to the second storage information, writing the first storage information into the nonvolatile storage circuit can be ensured.

(8) In the compound storage circuit, the nonvolatile storage circuit includes a magnetic tunnel junction element as storage means.

Thus, when the first storage information is written into the nonvolatile storage circuit, writing can be performed in a relatively short time.

(9) According to another aspect of the present invention, a semiconductor device including a compound storage circuit that includes a volatile storage circuit and a nonvolatile storage circuit connected in parallel to each other and that is arranged such that information equal to storage information stored in the volatile storage circuit is stored into the nonvolatile storage circuit includes a determination circuit for comparing first storage information stored in the volatile storage circuit with second storage information that has already been stored in the nonvolatile storage circuit when the storage information stored in the volatile storage circuit is written into the nonvolatile storage circuit. The first storage information is written into the nonvolatile storage circuit only when the first storage information is not equal to the second storage information.

Thus, since the number of writing times into the nonvolatile storage circuit can be reduced, power consumption in the semiconductor device can be reduced.

(10) In the semiconductor device, the determination circuit includes comparison determination means for comparing the first storage information with the second storage information; and writing means for writing the first storage information into the nonvolatile storage circuit only when the first storage information is not equal to the second storage information.

Thus, the determination circuit can perform determination processing quickly.

When the first storage information is not equal to the second storage information, writing the first storage information into the nonvolatile storage circuit can be ensured.

(11) In the semiconductor device, the nonvolatile storage circuit includes a magnetic tunnel junction element as storage means.

Thus, when the first storage information is written into the nonvolatile storage circuit, writing can be performed in a relatively short time.

(12) In the semiconductor device, when electric power supplied to the volatile storage circuit is reduced, the storage information stored in the volatile storage circuit is written into the nonvolatile storage circuit. When the power supply resumes after the electric power supplied is reduced, the storage information stored in the nonvolatile storage circuit is returned into the volatile storage circuit.

Thus, in the semiconductor device, only when storage information stored in the volatile storage circuit is likely to be lost due to a reduction in power supply, writing the storage information stored in the volatile storage circuit into the nonvolatile storage circuit can be ensured. This reduces the number of writing times into the nonvolatile storage circuit, thus reducing power consumption in the semiconductor device. In addition, information to be written into the nonvolatile storage circuit is information necessary when the power supply resumes after the reduction in the power supply. In addition, by returning the storage information stored in the nonvolatile storage circuit into the volatile storage circuit when power supply resumes, necessary information can be used from the volatile storage circuit, which has a high reading speed. Thus, a quick instant-on function can be realized.

(13) In the semiconductor device, each of the volatile storage circuit and the nonvolatile storage circuit includes power source supply means that operates when the electric power supplied is reduced.

Thus, even if the power supply is reduced, the power source supply means can operate the volatile storage circuit and the nonvolatile storage circuit for a predetermined period. Accordingly, storing necessary information into the nonvolatile storage circuit can be ensured.

(14) In the semiconductor device, a magnetic tunnel junction element is used as storage means.

Thus, when the first storage information is written into the nonvolatile storage circuit, writing can be performed in a relatively short time.

(15) In the semiconductor device, the determination circuit includes comparison determination means for comparing the first storage information with the second storage information; and writing means for writing the first storage information into the nonvolatile storage circuit only when the first storage information is not equal to the second storage information.

Thus, the determination circuit can perform determination processing quickly.

When the first storage information is not equal to the second storage information, writing the first storage information into the nonvolatile storage circuit can be ensured.

(16) In the semiconductor device, a magnetic tunnel junction element is used as storage means.

Thus, when the first storage information is written into the nonvolatile storage circuit, writing can be performed in a relatively short time.

The invention claimed is:

1. A compound storage circuit that includes a volatile storage circuit and a nonvolatile storage circuit connected in parallel to each other and that is arranged such that information equal to storage information stored in the volatile storage circuit is stored into the nonvolatile storage circuit, the compound storage circuit comprising a determination circuit for comparing first storage information stored in the volatile storage circuit with second storage information that has already been stored in the nonvolatile storage circuit when the storage information stored in the volatile storage circuit is written into the nonvolatile storage circuit, wherein the first storage information is written into the nonvolatile storage circuit only when the first storage information is not equal to the second storage information, and first and second circuit selection switches responsive to a power source separation signal to cause the volatile storage circuit to be independent from the other storage circuit.

2. The compound storage circuit according to claim 1, wherein the determination circuit includes:
   comparison determination means for comparing the first storage information with the second storage information; and
   writing means for writing the first storage information into the nonvolatile storage circuit only when the first storage information is not equal to the second storage information.

3. The compound storage circuit according to claim 1 or 2, wherein the nonvolatile storage circuit includes a magnetic tunnel junction element as storage means.

4. The compound storage circuit according to claim 1, wherein:
   when electric power supplied to the volatile storage circuit is reduced, the storage information stored in the volatile storage circuit is written into the nonvolatile storage circuit; and
   when power supply resumes after the electric power supplied is reduced, the storage information stored in the nonvolatile storage circuit is returned into the volatile storage circuit.

5. The compound storage circuit according to claim 4, wherein each of the volatile storage circuit and the nonvolatile storage circuit includes power source supply means that operates when the electric power supplied is reduced.

6. The compound storage circuit according to claim 4 or 5, wherein the nonvolatile storage circuit includes a magnetic tunnel junction element as storage means.

7. The compound storage circuit according to claim 4 or 5, wherein the determination circuit includes:
   comparison determination means for comparing the first storage information with the second storage information; and
   writing means for writing the first storage information into the nonvolatile storage circuit only when the first storage information is not equal to the second storage information.

8. The compound storage circuit according to claim 7, wherein the nonvolatile storage circuit includes a magnetic tunnel junction element as storage means.

9. A semiconductor device including a compound storage circuit that includes a volatile storage circuit and a nonvolatile storage circuit connected in parallel to each other and that is arranged such that information equal to storage information stored in the volatile storage circuit is stored into the nonvolatile storage circuit, the semiconductor device comprising
   a determination circuit for comparing first storage information stored in the volatile storage circuit with second storage information that has already been stored in the nonvolatile storage circuit when the storage information stored in the volatile storage circuit is written into the nonvolatile storage circuit, wherein the first storage information is written into the nonvolatile storage circuit only when the first storage information is not equal to the second storage information; and
   a first circuit selection switch and a second circuit selection switch, each responsive to a power source separation signal via a power source separation signal input line to cause the volatile storage circuit to be independent from other storage circuits.

10. The semiconductor device according to claim 9, wherein the determination circuit includes:
    comparison determination means for comparing the first storage information with the second storage information; and
    writing means for writing the first storage information into the nonvolatile storage circuit only when the first storage information is not equal to the second storage information.

11. The semiconductor device according to claim 9 or 10, wherein the nonvolatile storage circuit includes a magnetic tunnel junction element as storage means.

12. The semiconductor device according to claim 11, wherein:
    when electric power supplied to the volatile storage circuit is reduced, the storage information stored in the volatile storage circuit is written into the nonvolatile storage circuit; and
    when power supply resumes after the electric power supplied is reduced, the storage information stored in the nonvolatile storage circuit is returned into the volatile storage circuit.

13. The semiconductor device according to claim 12, wherein each of the volatile storage circuit and the nonvolatile storage circuit includes power source supply means that operates when the electric power supplied is reduced.

14. The semiconductor device according to claim 12, wherein the nonvolatile storage circuit includes a magnetic tunnel junction element as storage means.

15. The semiconductor device according to claim 12, wherein the determination circuit includes:
    comparison determination means for comparing the first storage information with the second storage information; and
    writing means for writing the first storage information into the nonvolatile storage circuit only when the first storage information is not equal to the second storage information.

16. The semiconductor device according to claim 15, wherein the nonvolatile storage circuit includes a magnetic tunnel junction element as storage means.

17. The semiconductor device according to claim 13, wherein the nonvolatile storage circuit includes a magnetic tunnel junction element as storage means.

18. The semiconductor device according to claim 13, wherein the determination circuit includes:
    comparison determination means for comparing the first storage information with the second storage information; and
    writing means for writing the first storage information into the nonvolatile storage circuit only when the first storage information is not equal to the second storage information.

19. A semiconductor device including a compound storage circuit that includes a volatile storage circuit and a nonvolatile storage circuit connected in parallel to each other and that is arranged such that information equal to storage information stored in the volatile storage circuit is stored into the nonvolatile storage circuit, the semiconductor device comprising:
    a determination circuit for comparing first storage information stored in the volatile storage circuit with second storage information that has already been stored in the nonvolatile storage circuit when the storage information stored in the volatile storage circuit is written into the nonvolatile storage circuit, wherein the first storage information is written into the nonvolatile storage circuit only when the first storage information is not equal to the second storage information; and a first circuit selection switch and a second circuit selection switch, each responsive to a power source separation signal via a power source separation signal input line to cause the volatile storage circuit to be independent from other storage circuits by cutting off a first conducting wire in circuit with said first circuit selection switch, and a second conducting wire in circuit with said second circuit selection switch, whereby information is prevented from being input to the volatile storage circuit and storage information stored in the volatile storage circuit 2 is inhibited from being changed after the power supply is turned off.

* * * * *

UNITED STATES PATENT AND TRADEMARK OFFICE
CERTIFICATE OF CORRECTION

| | | |
|---|---|---|
| PATENT NO. | : 7,130,224 B2 | Page 1 of 1 |
| APPLICATION NO. | : 10/522316 | |
| DATED | : October 31, 2006 | |
| INVENTOR(S) | : Katsutoshi Moriyama et al. | |

It is certified that error appears in the above-identified patent and that said Letters Patent is hereby corrected as shown below:

Title Page:
Item (54) should read as follows:
-- COMPOUND STORAGE CIRCUIT AND SEMICONDUCTOR DEVICE INCLUDING COMPOUND STORAGE CIRCUT --.

Signed and Sealed this

Tenth Day of July, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,130,224 B2 | Page 1 of 1 |
| APPLICATION NO. | : 10/522316 | |
| DATED | : October 31, 2006 | |
| INVENTOR(S) | : Katsutoshi Moriyama et al. | |

It is certified that error appears in the above-identified patent and that said Letters Patent is hereby corrected as shown below:

Title Page:
Item (54) should be read as follows:
-- COMPOUND STORAGE CIRCUIT AND SEMICONDUCTOR DEVICE INCLUDING COMPOUND STORAGE CIRCUIT --.

Signed and Sealed this

Eighteenth Day of December, 2007

JON W. DUDAS
*Director of the United States Patent and Trademark Office*